(12) United States Patent
Park et al.

(10) Patent No.: US 8,278,670 B2
(45) Date of Patent: Oct. 2, 2012

(54) LIGHT EMITTING APPARATUS AND DISPLAY APPARATUS HAVING THE SAME

(75) Inventors: Dong Wook Park, Gwangju (KR); Jun Seok Park, Gwangju (KR); Hyung Hwa Park, Incheon (KR); Han Sin, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 530 days.

(21) Appl. No.: 12/404,042

(22) Filed: Mar. 13, 2009

(65) Prior Publication Data

US 2009/0236620 A1    Sep. 24, 2009

(30) Foreign Application Priority Data

Mar. 14, 2008  (KR) ................. 10-2008-0023792

(51) Int. Cl.
*H01L 33/00* (2010.01)
(52) U.S. Cl. .................. 257/89; 257/E33.055
(58) Field of Classification Search .............. 257/89, 257/E33.055
See application file for complete search history.

(56) References Cited

U.S. PATENT DOCUMENTS

| | | | |
|---|---|---|---|
| 6,508,564 B1 | 1/2003 | Kuwabara et al. | |
| 7,294,956 B2 * | 11/2007 | Maeda et al. | 313/486 |
| 2004/0090174 A1 | 5/2004 | Tasch et al. | |
| 2005/0135094 A1 | 6/2005 | Lee et al. | |
| 2006/0245208 A1 | 11/2006 | Sakamoto et al. | |
| 2007/0194333 A1 | 8/2007 | Son | |
| 2007/0274093 A1 | 11/2007 | Haim et al. | |
| 2007/0291467 A1 | 12/2007 | Nagai et al. | |
| 2009/0146158 A1 * | 6/2009 | Park | 257/89 |

FOREIGN PATENT DOCUMENTS

| | | |
|---|---|---|
| KR | 10-2005-0111666 A | 11/2005 |
| KR | 10-2006-0120908 A | 11/2006 |
| KR | 10-2007-0087270 A | 8/2007 |
| KR | 10-2007-0118196 A | 12/2007 |
| WO | WO 2007/114614 A1 | 10/2007 |
| WO | WO 2007/125623 A1 | 11/2007 |
| WO | WO 2009/093895 A1 | 7/2009 |

* cited by examiner

*Primary Examiner* — Matthew W Such
*Assistant Examiner* — Monica D Harrison
(74) *Attorney, Agent, or Firm* — Birch, Stewart, Kolasch & Birch, LLP

(57) ABSTRACT

Disclosed are a light emitting apparatus and a display apparatus having the same. The light emitting apparatus comprises a first light emitting device which emits a light of a target color tinged with a first color, and a second light emitting device which emits a light of the target color tinged with a second color complementary to the first color with respect to the target color.

6 Claims, 9 Drawing Sheets

LIGHT EMITTING APPARATUS AND DISPLAY APPARATUS HAVING THE SAME

CROSS-REFERENCE TO RELATED APPLICATIONS

The present application claims priority under 35 U.S.C. 119 to Korean Patent Application No. 10-2008-0023792 (filed on Mar. 14, 2008), which is hereby incorporated by reference in its entirety.

BACKGROUND

The embodiment relates to a light emitting apparatus and a display apparatus having the same.

Recently, research and development on a light emitting device has been actively performed. When taking the application of such a light emitting device into consideration, the development of a white light emitting device may be an important issue. This is because a full color display representing a high image quality may be manufactured by combining a color filter with the white light emitting device having sufficient brightness, sufficient light emitting efficiency, a long life span, and sufficient chromaticity. In addition, the white light emitting device may be employed as a white light source such as a backlight unit or an illumination.

Accordingly, a light emitting device having the package of LED chips and phosphors has been developed. Since such a light emitting device can emit colorful light, the light emitting device is used as a light source in various application fields.

SUMMARY

The embodiment provides a light emitting apparatus provided by combining light emitting devices emitting target lights tingeing complementary colors, and a display apparatus having the same.

The embodiment provides a light emitting apparatus and a display apparatus having the same, capable of representing a target chromaticity by mixing lights emitted from light emitting devices having chromaticity out of the target chromaticity.

An embodiment provides a light emitting apparatus comprising: a first light emitting device which emits a light of a target color tinged with a first color, and a second light emitting device which emits a light of the target color tinged with a second color complementary to the first color with respect to the target color.

An embodiment provides a light emitting apparatus comprising: a first light emitting device which emits a light of a target color tinged with a first color; a second light emitting device which emits a light of the target color tinged with a second color complementary to the first color; and a board comprising the first and second light emitting devices thereon, at least one of the first and second light emitting devices have chromaticity distribution that is out of a target chromaticity area.

An embodiment provides a display apparatus comprising: a light emitting apparatus which comprises a first light emitting device emitting a light of a target color tinged with a first color, and a second light emitting device emitting a light of the target color tinged with a second color complementary to the first color with respect to the target color, and a display panel which displays information by light irradiated from the light emitting apparatus.

As described above, according to the embodiment, the use efficiency of light emitting devices can be improved.

According to the embodiment, the use efficiency of an LED chip can be improved.

BRIEF DESCRIPTION OF THE DRAWINGS

FIGS. 3A to 3C are graphs showing a color coordinate range based on complementary colors, in which FIG. 3A is a graph showing CIE color coordinates of a blue color and a yellow color, FIG. 3B is a graph showing a complementary relation of FIG. 3A, and FIG. 3C is a graph showing spectrum data according to colors;

FIGS. 4A to 4C are graphs showing a color coordinate range based on complementary colors, in which FIG. 4A is a graph showing CIE color coordinates of a blue color, a red color, and a yellow color, FIG. 4B is a graph showing a complementary relation among the colors, and FIG. 4C is a graph showing spectrum data according to colors;

FIGS. 5A to 5C are graphs showing a color coordinate range based on complementary colors, in which FIG. 5A is a graph showing CIE color coordinates of a blue color, a red color, a green color, and a yellow color, FIG. 5B is a graph showing a complementary relation among the colors, and FIG. 5C is a graph showing spectrum data according to colors;

DETAILED DESCRIPTION OF THE EMBODIMENTS

Hereinafter, embodiments will be described with reference to accompanying drawings.

Figure 1:
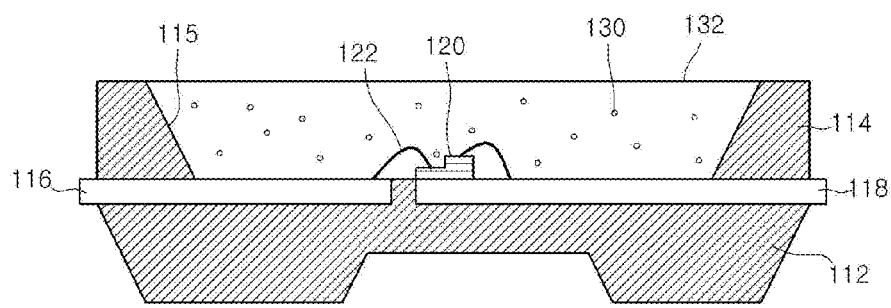
FIG. 1 is a side sectional view showing a light emitting device according to a first embodiment.

FIG. 1 is a sectional view showing a first light emitting device 101 according to a first embodiment.

Referring to FIG. 1, the first light emitting device 101 comprises a package body 112, a cavity 115, a plurality of electrodes 116 and 118, a light emitting diode (LED) 120, a phosphor 130, and a resin member 132.

The package body 112 may be fabricated by using a metal core PCB (MCPCB), a silicon material, a wafer level package (WLP) based on the silicon material, silicon carbide (SiC), FR-4 polyphthalamide (PPA), aluminum nitride (AlN), liquid crystal polymer, or a printed circuit board (PCB), and the embodiment is not limited thereto. In addition, the first light emitting device 101 may be realized in the form of a chip on board (COB) as well as a package.

The package body 112 may be comprises a reflection part 114 and the cavity 115. The reflection part 114 is provided while surrounding the cavity 115. The reflection part 114 may have an inner side surface perpendicular to a bottom surface or inclined outward. The reflection part 114 may be integrated with the package body 112 or separated from the body 112.

The reflection part 114 is provided around the cavity 115 to reflect an incident light. The cavity 115 comprises a recess having a predetermined depth, and has a circular shape or a polygonal shape when viewed in a plan view. However, the embodiment is not limited to the depth and the shape. In addition, the package body 112 may not comprise the reflection part 114 and the cavity 115.

The electrodes 116 and 118 are spaced apart from each other. One side of the electrodes 116 and 118 is provided in the cavity 115, and the opposite side of the electrodes 116 and 118 may be exposed out of both sides of the package body 112. The configuration of the electrodes 116 and 118 may be modified through a trimming/forming process within the technical scope of the embodiment.

The electrodes 116 and 118 may be realized in the form of lead terminals such as PCB type lead terminals, lead-frame type lead terminals, ceramic type lead terminals, or via-hole type lead terminals. In addition, the lead terminals can be prepared through a plating scheme.

The LED 120 is provided in the cavity 115, and attached to one (the electrode 118) of the electrodes 116 and 118. The LED 120 may be electrically connected to the electrodes 116 and 118 through a wire 122. According to the embodiment, the LED 120 may be electrically connected to the electrodes 116 and 118 through at least one of a wire bonding scheme, a die bonding scheme, and a flip bonding scheme.

The LED 120 may be mounted in the form of a chip. Such an LED chip may be realized using III and V group-compound semiconductor devices such as indium gallium nitride (InGaN) and gallium nitride (GaN) to emit light having a wavelength of 440 nm to 480 nm. The LED chip may comprise a green LED chip, a red LED chip, or an UV LED chip as well as a blue LED chip. For the purpose of explanation, the blue LED chip will be representatively described below.

The resin member 132 is provided in the cavity 115. The resin member 132 may be molded using a resin material having light transmittance. The molding scheme may comprise a transfer molding scheme, a compression molding scheme, an injection molding scheme, or a dispensing molding scheme. The resin material may comprise silicon or epoxy.

The phosphor 130 may be added to the resin member 132. The phosphor 130 may comprise at least one kind of phosphors. The phosphor 130 absorbs light, which has been emitted from the LED 120, to radiate light having a wavelength different from that of the absorbed light.

The phosphor 130 may comprise at least one of a yellow phosphor, a red phosphor, a green phosphor, and an orange phosphor. For the purpose of explanation, the yellow phosphor will be representatively described below.

The yellow phosphor may comprise a YAG phosphor or a silicate phosphor. The silicate-based yellow phosphor comprises particles comprising strontium (Sr), barium (Ba), magnesium (Mg), gallium (Ga), or sulfur (S). For example, the silicate-based yellow phosphor may comprise $Sr_5BaMgSiO_2$: $Eu^{2+}$, $SrGa_2S_4:Eu^{2+}$, $Sr_2Ga_2S_5:Eu^{2+}$ or the like. The type of the phosphor or the rate of content of elements of each phosphor may be changed, and the embodiment is not limited thereto.

The resin member 130 may be provided thereon with a lens (not shown). The lens may be integrated with the resin member 130 or separated from the resin member 130. The resin member 130 may have a flat, concave, or convex surface, and the embodiment is not limited thereto.

If a forward driving voltage is applied to the first light emitting device 101, the LED 120 emits light. The phosphor 130 absorbs a portion of light emitted from the LED 120 to emit light having a wavelength different from the absorbed light. If the LED 120 is a blue LED chip, the LED 120 emits light having a wavelength of 440 nm to 480 nm. If the phosphor 130 is a yellow-based phosphor, the phosphor 130 may light having a wavelength of 500 nm to 700 nm.

The first light emitting device 101 emits white light, which is target light, by mixing the blue light and the yellow light.

The first light emitting device 101 may emit the target light (e.g., white light) having various color tints according to a chip characteristic and the rate of content of a phosphor. The white light may be divided into bluish white, yellowish white, reddish white, and greenish white according to the difference between the color tints.

Figure 2:
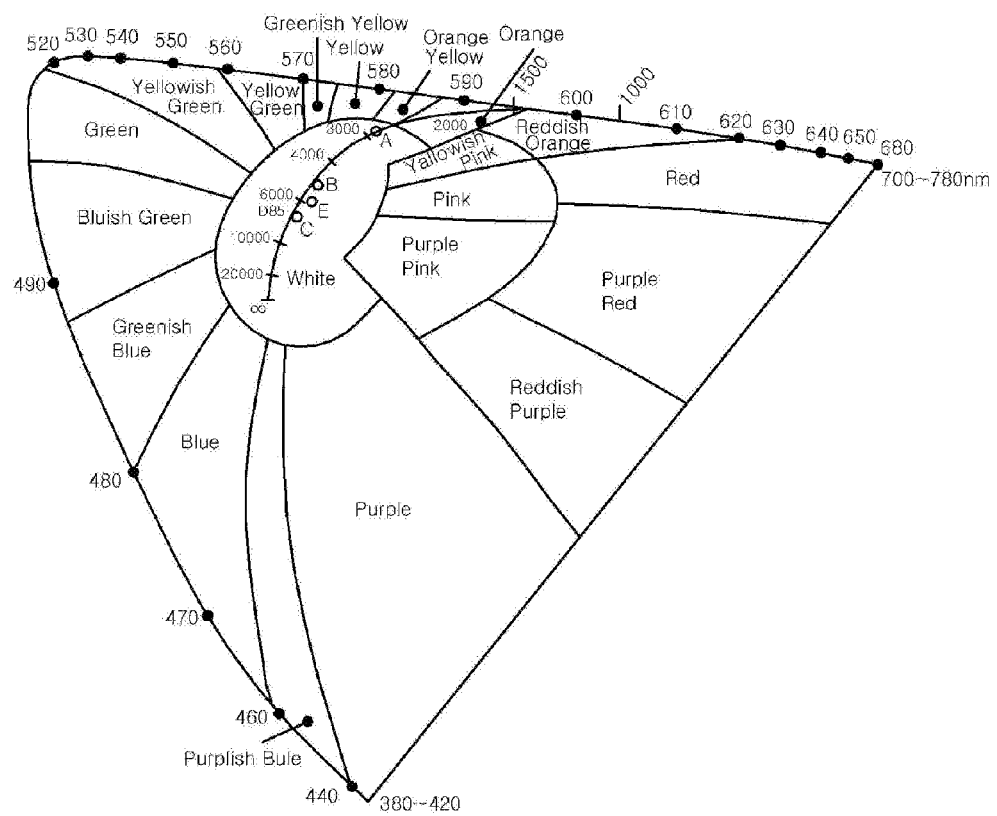
FIG. 2 is a view showing the distribution of CIE color coordinates of a light emitting device.

FIG. 2 is a view showing the distribution of CIE color coordinates of the first light emitting device 101.

Referring to FIG. 2, the first light emitting device 101 can emit a light having a wavelength of 380 nm to 780 nm, and lights having various colors can be realized by mixing colors having different wavelengths based on the CIE color coordinates.

Figure 3:
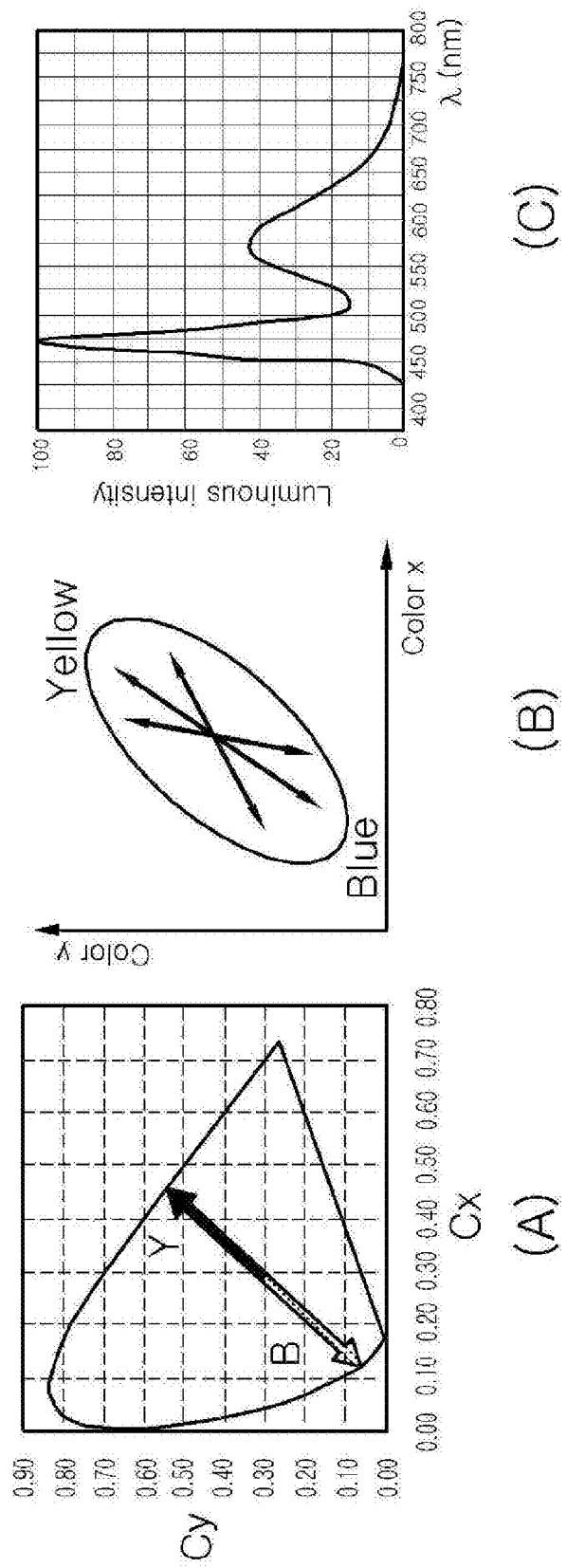

FIGS. 3A to 3C are graphs showing a color coordinate range based on complementary colors. FIG. 3A is a graph showing CIE color coordinates of a blue color and a yellow color, FIG. 3B is a graph showing a complementary relation of FIG. 3A, and FIG. 3C is a graph showing spectrum data according to colors.

Referring to FIGS. 3A and 3B, in the CIE color coordinates, a blue color and a yellow color serve as complementary colors thereof relative to a white color (target color). FIG. 3C is a graph showing spectrum data of the blue color and the yellow color, in which an X-axis represents a wavelength employing 'nm' as a unit, and a Y-axis represents a luminous intensity. Accordingly, blue light and yellow light, which have a complementary relation therebetween in the CIE color coordinates, are mixed with each other, thereby realizing white light.

Figure 4:
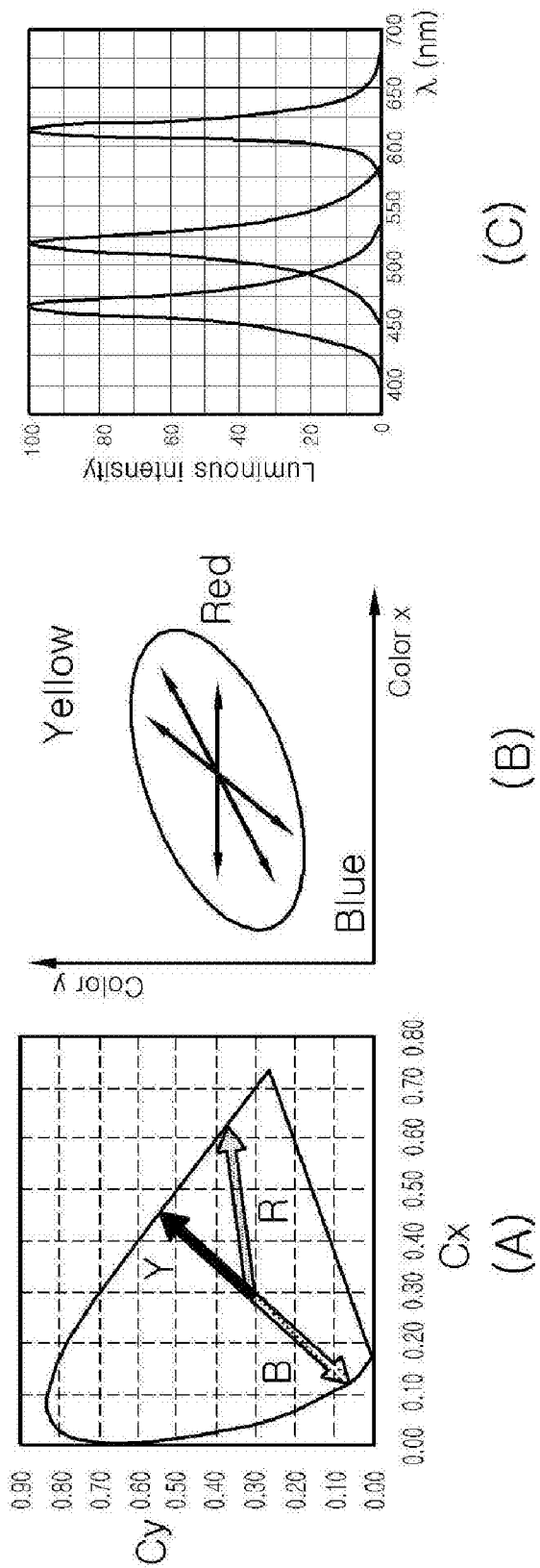

FIGS. 4A to 4C are graphs showing a color coordinate range based on complementary colors. FIG. 4A is a graph showing CIE color coordinates of a blue color, a red color, and a yellow color, FIG. 4B is a graph showing a complementary relation among the colors, and FIG. 4C is a graph showing spectrum data according to colors.

Referring to FIGS. 4A and 4B, in the CIE color coordinates, a blue color, a red color, and a yellow color serve as complementary colors to make the white color (target color). FIG. 4C is a graph showing spectrum data of the blue color, the red color, and the yellow color, in which an X-axis represents a wavelength employing 'nm' as a unit, and a Y-axis represents a luminous intensity. Accordingly, blue light, red light and green light, which have a complementary relation in the CIE color coordinates, are mixed with each other, thereby realizing white light.

Figure 5:
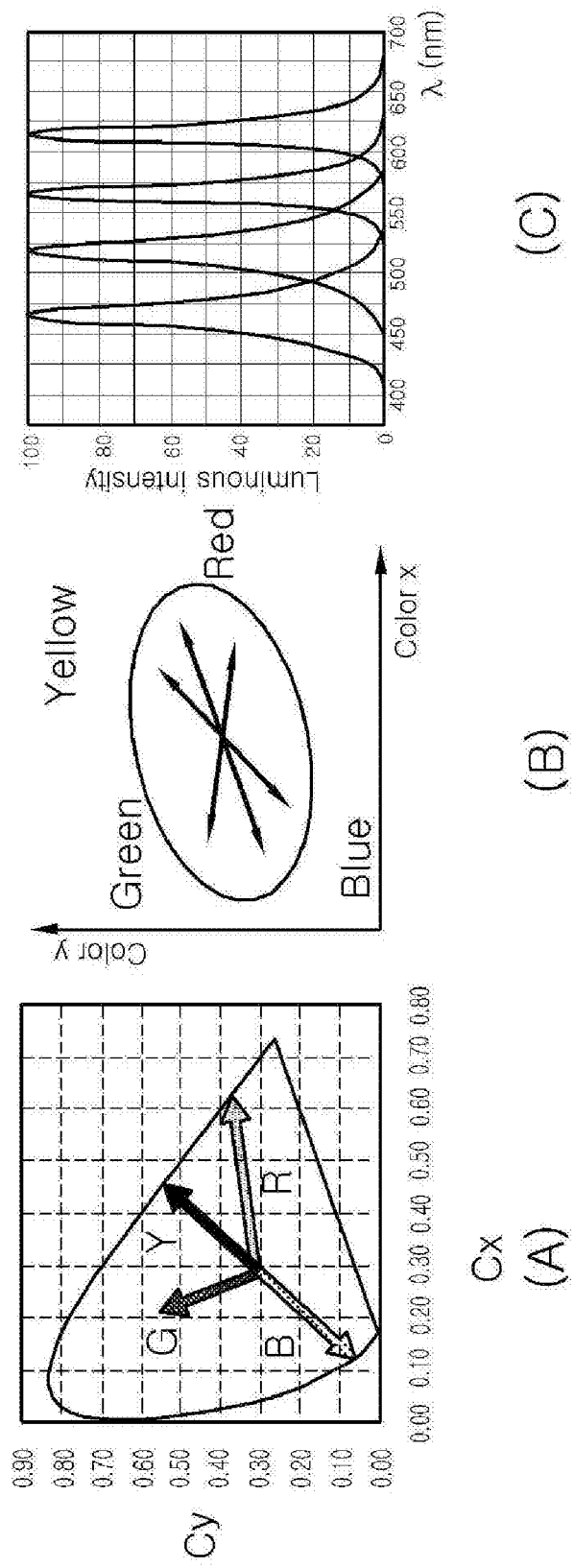

FIGS. 5A to 5C are graphs showing a color coordinate range based on complementary colors. FIG. 5A is a graph showing CIE color coordinates of a blue color, a red color, a green color, and a yellow color, FIG. 5B is a graph showing a complementary relation among the colors, and FIG. 5C is a graph showing spectrum data according to colors.

Referring to FIGS. 5A and 5B, in the CIE color coordinates, a blue color, a red color, a green color, and a yellow color serve as complementary colors to make the white color (target color). FIG. 5C is a graph showing spectrum data of the blue color, the red color, the green color, and the yellow color, in which an X-axis represents a wavelength employing 'nm' as a unit, and a Y-axis represents a luminous intensity. Accordingly, blue light, red light, green light, and yellow light, which have a complementary relation in the CIE color coordinates, are mixed with each other, thereby realizing white light.

In this case, the blue light has a wavelength of 440 nm to 460 nm, and the green light has a wavelength of 525 nm to 535 nm. The red light has a wavelength of 615 nm to 630 nm, and the yellow light has a wavelength of 510 nm to 525 nm.

Figure 6:
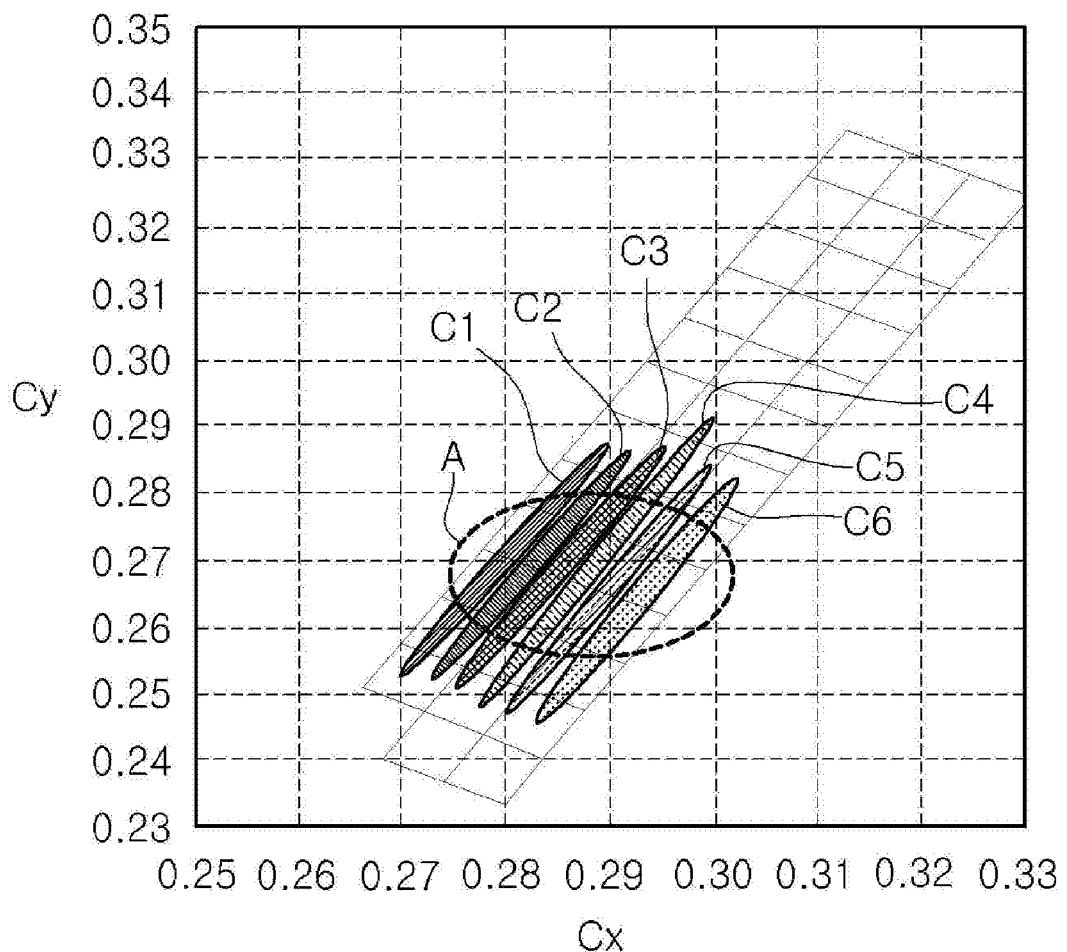
FIG. 6 is a graph showing an example of the distribution of color coordinates of the light emitting device shown in FIG. 1.
Figure 7:
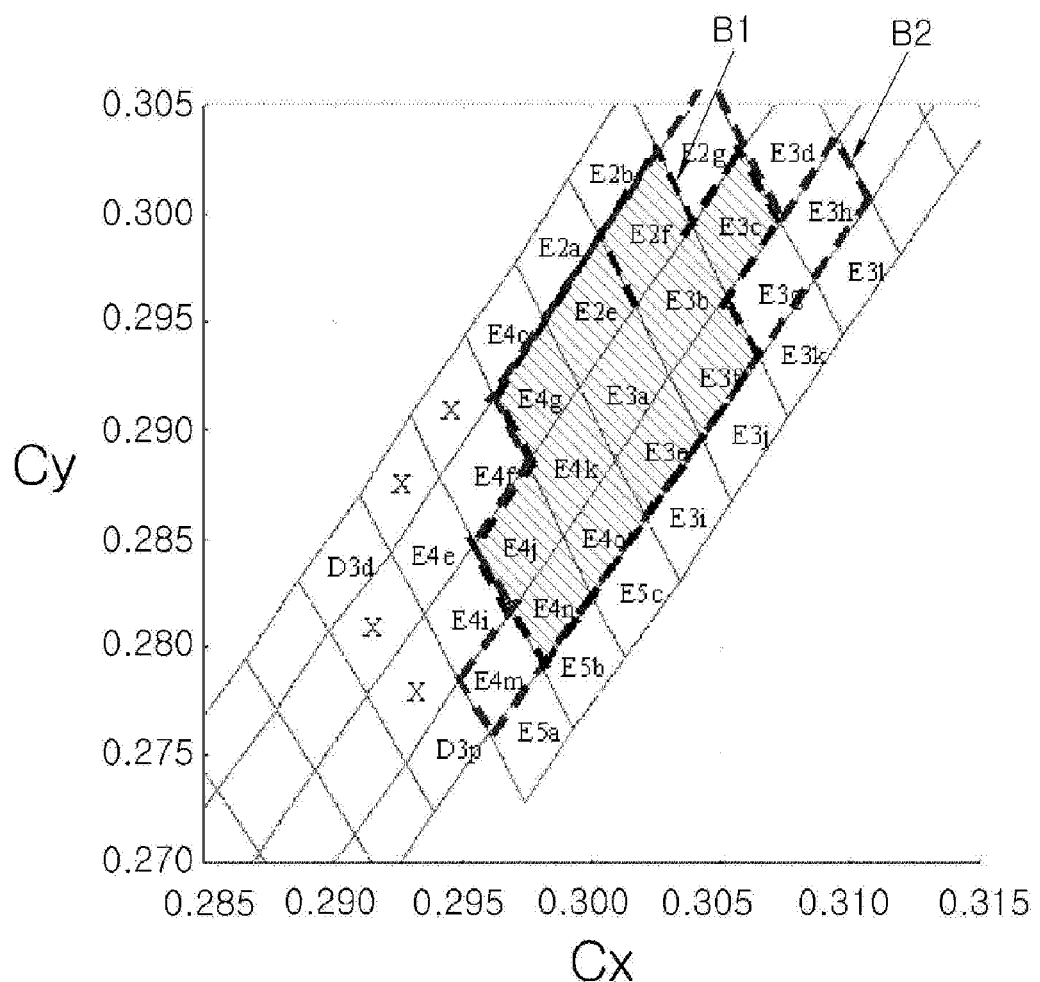
FIG. 7 is a graph showing an example of the distribution of color coordinates, which are actually used and selected from an area A of the color coordinates of FIG. 6.

FIG. 6 is a view showing the distribution of the color coordinates of the first light emitting device 101 of FIG. 1, and FIG. 7 is a view showing a target chromaticity area A, which is applicable to a product, in the distribution of the color coordinates shown in FIG. 6.

Referring to FIG. 6, the first light emitting device 101 emits white lights by a blue LED and a yellow phosphor. In this case, the white lights are distributed with various color tints according to the rate of content of the yellow phosphor. For example, the white lights represents the distribution of color tints of a green color (C1), an orange color (C2), a blue color (C3), a red color (C4), a yellowish green (C5), and a yellow color (C6) in the color coordinates (a Cx coordinate is in the range of 0.27 to 0.3, and a Cy coordinate is in the range of 0.25 to 0.29).

Referring to FIG. 7, when light emitting devices having the distribution of the color coordinates shown in FIG. 6 are adapted to products, only light emitting devices representing chromaticity in target chromaticity areas (B1 and B2) are employed. For example, the first company employs white light emitting devices having chromaticity in the target chromaticity area (B1), and the second company employs white light emitting devices having chromaticity in the target chromaticity area (B2≧B1). The target chromaticity may be defined as a target chromaticity rank.

The white light emitting devices having chromaticity out of the target chromaticity areas (B1 and B2) cannot be supplied to the first and second companies. In this case, the use efficiency may be less than 40%. The embodiment can be provided to enable the use of the light emitting devices having chromaticity distribution out of the target chromaticity areas (B1 and B2).

Referring to FIG. 7, a target chromaticity of E3$a$ can be realized by combining two light emitting devices having the chromaticity distribution of E2$e$ and E3$e$, and the chromaticity distribution of E4$k$ and E3$b$ in the color coordinate distribution.

A target chromaticity of E3$a$ can be realized by combining two light emitting devices having the chromaticity distribution of E2$a$ to E3$i$, or the chromaticity distribution of E4$i$ to E3$d$, in which the E2$a$ and E3$i$ have a complementary relation therebetween, and the E4$i$ and E3$d$ have a complementary relation therebetween in the distribution of the color coordinates. A target chromaticity of E4$k$ can be realized by combining two light emitting devices having the chromaticity distribution of E4$c$ to E5$c$, or the chromaticity distribution of E4$i$ to E3$b$, in which the E4$c$ and E5$c$ have a complementary relation therebetween, and the E4$i$ and E3$b$ have a complementary relation therebetween in the distribution of the color coordinates. A target chromaticity of E4$n$ can be realized by combining three light emitting devices having the chromaticity distribution of E5$c$, E4$i$, and E5$a$. A target chromaticity of E4$n$ can be realized by combining three light emitting devices having the chromaticity distribution of E5$c$, E4$i$, and E5$a$. A target chromaticity of E3$a$ can be realized by combining three light emitting devices having the chromaticity distribution of E4$c$, E4$f$, and E3$k$. Therefore, according to the embodiment, a white light emitting apparatus can be realized by combining at least two light emitting devices having a complementary relation therebetween or a symmetrical relation therebetween among light emitting devices having a target chromaticity area and the chromaticity distribution thereof. For example, the light emitting devices may emit bluish white light, yellowish white light, reddish white light, and greenish white light.

The white light emitting apparatus may be realized by combining light emitting devices arranged symmetrically to each other about reference chromaticity, or arranged in a circular configuration, a polygonal configuration, or various geometrical configurations.

At least one of a plurality of light emitting devices may have a chromaticity existing out of a target chromaticity area or existing in the target chromaticity area. The use efficiency of light emitting devices can be raised to 80% or more by using a plurality of white light emitting devices having such a complementary relation.

Figure 8:
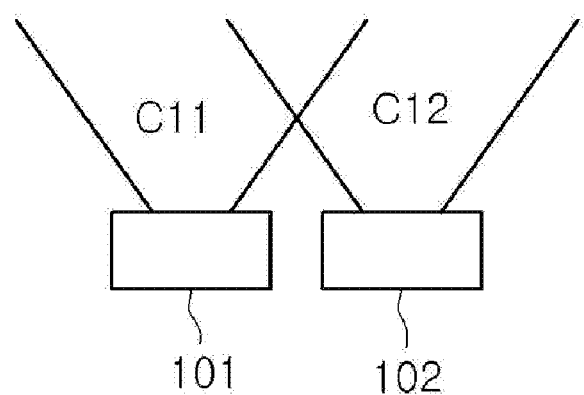
FIG. 8 is a view showing a light emitting device according to a second embodiment.

FIG. 8 is a sectional view showing a light emitting apparatus 110 according to a second embodiment.

Referring to FIG. 8, the light emitting apparatus 110 comprises the first light emitting device 101 and a second light emitting device 102. The first and second light emitting devices 101 and 102 emit target lights having different color tints.

The first light emitting device 101 emits a target light C11 tinged with a first light, and the second light emitting device 102 emits a target light C12 tinged with a second light complementary to the first light. For example, the first light emitting device 101 may emit bluish white light, and the second light emitting device 102 may emit yellowish white light.

The first and second light emitting devices 101 and 102 have color tints having a complementary relation therebetween in the range of the white light. In addition, since at least one of the first and second light emitting devices 101 and 102 has a chromaticity out of a target chromaticity area, the use efficiency of the light emitting devices can be improved.

The light emitting apparatus 110 may additionally comprise other light emitting devices, and the light emitting devices may emit a light having a target chromaticity or a light that does not exert an influence on the target chromaticity. In other words, at least one of three light emitting devices or more may not have a complementary relation with respect to remaining light emitting devices.

Figure 9:
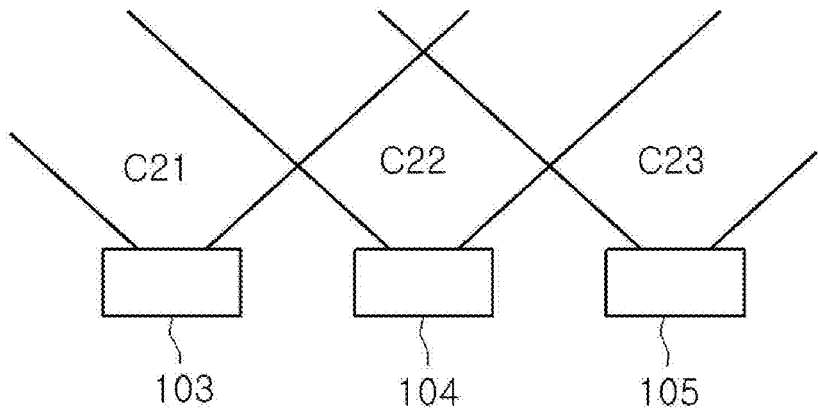
FIG. 9 is a view showing a light emitting device according to a third embodiment.

FIG. 9 is a view showing a light emitting apparatus 110A according to a third embodiment.

Referring to FIG. 9, the light emitting apparatus 110A comprises third to fifth light emitting devices 103, 104, and 105.

The third to fifth light emitting devices 103 to 105 emit target lights C21, C22, and C23 tinged with a color tint of a complementary relation. For example, the third light emitting device 103 emits a bluish white light, the fourth light emitting device 104 emits a greenish white light, and the third light emitting device emits a reddish white light. If such lights emitted from the third to fifth light emitting devices 103, 104, and 105 are mixed, lights obtained through the mixture exist in a target chromaticity area.

At least one of the third to fifth light emitting devices 103, 104, and 105 employs a chromaticity existing out of the target chromaticity area, so that the use efficiency of the light emitting devices can be improved.

According to the embodiment, a target chromaticity is realized by combining at least two white light emitting devices of color tints of a complementary relation. Accordingly, a light emitting device that is out of the target chromaticity can be used to improve the use efficiency.

Meanwhile, although it has been described in that a blue LED is employed for a reference color, the embodiment is not limited to the blue LED. For example, as well as the white light, lights having different colors can be generated by mixing lights obtained through the combination of different LEDs and phosphors without using the blue LED.

Additionally, in order to realize the white light, as well as light emitting devices having a complementary relation, all possible combination of complementary colors, for example, light emitting devices having different optical characteristics (comprising chromaticity and brightness) may be used.

Figure 10:
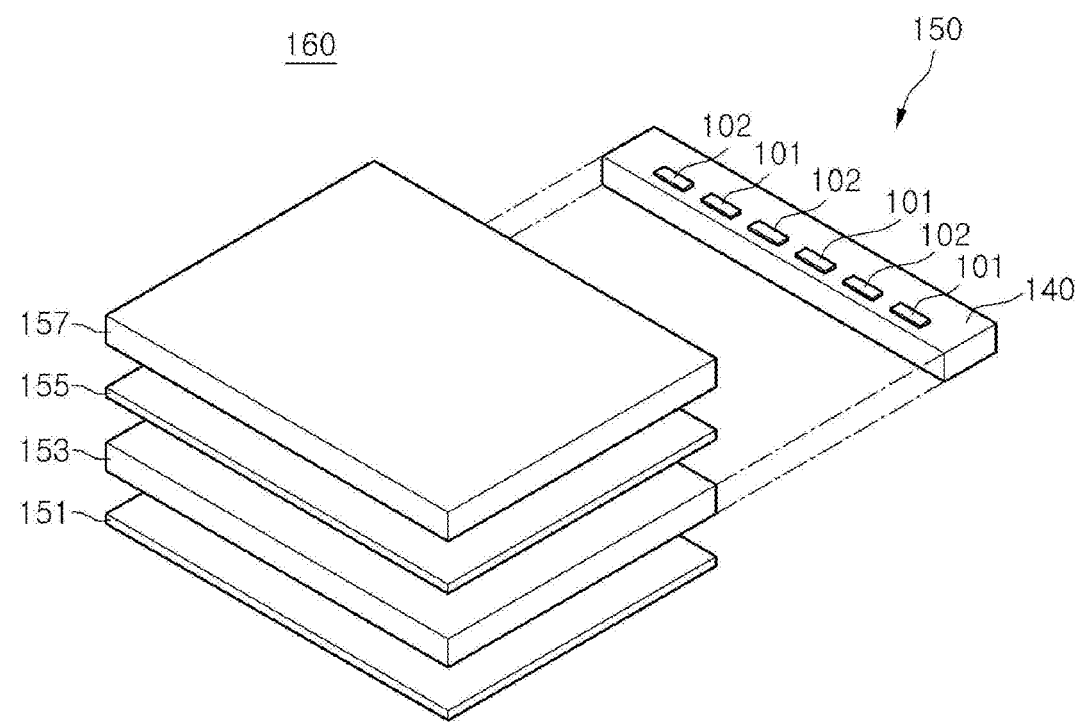
FIG. 10 is a view showing a display apparatus according to a fourth embodiment.

FIG. 10 is a view showing a display apparatus 100 according to a fourth embodiment.

Referring to FIG. 10, the display apparatus 160 comprises a light emitting apparatus 150 provided therein with a board 140 and the first and second light emitting devices 101 and 102, a reflective plate 151, a light guide plate 153, an optical sheet 155, and a display panel 157.

The light emitting apparatus 150 comprises the first and second light emitting devices 101 and 102 alternately aligned on the board 140. The first and second light emitting devices 101 and 102 emit white lights tinged with a color tint of a complementary relation therebetween. For example, the first light emitting device 101 emits a bluish white light, and the second light emitting device 102 emits a yellowish white light.

The first and second light emitting devices 101 and 102 may be realized using a blue LED and a yellow-based phosphor. At least one of the first and second light emitting devices 101 and 102 may be realized by using at least one of a red LED, a green LED, a blue LED, and an UV LED and at least one kind of a phosphor.

In the light emitting apparatus 150, the two light emitting devices 101 and 102 with a color tint of complementary relation may be provided in a mixed color area. The first and second light emitting devices 101 and 102 may be arranged on the board 140. The board 140 may be manufactured by using a hard material or a flexible material.

The first and second light emitting devices 101 and 102 may be alternately aligned one by one. In addition, the first and second light emitting devices 101 and 102 may be alternately aligned in a group unit. In addition, at least one of other light emitting devices may be interposed between the first and second light emitting devices 101 and 102 and between a group of the first light emitting device 101 and a group of the second light emitting device 102. At least one row of the first and second light emitting devices 101 and 102 may be arranged in a zig-zag manner. However, the embodiment is not limited thereto.

The light emitting apparatus 150 can emit a target light with a target chromaticity by mixing lights, which are emitted from the first and second light emitting devices 101 and 102 and have color tints of a complementary relation. Accordingly, the use efficiency of the light emitting device can be raised to 80% or more, and the range of a color coordinate target can be reduced.

The first and second light emitting devices 101 and 102 may be arranged in a group unit based on different forward driving voltages (Vf) and/or different luminous intensities (Iv) relative to a reference value (a reference value of an LED). For example, the first and second light emitting devices 101 and 102 having higher forward driving voltage and lower forward driving voltage on the basis of a reference voltage can be arranged together. In addition, the first and second light emitting devices 101 and 102 having higher luminous intensity and lower luminous intensity can be arranged together.

The light guide plate 153 is provided at one side of the light emitting device 150, and the reflective plate 151 is provided at a lower portion of the light guide plate 153. The optical sheet 155 is provided at an upper portion of the light guide plate 153. The light guide plate 153 may comprise a PC material or a polymethyl methacrylate (PMMA) material, and the embodiment is not limited thereto.

Light emitted from the light emitting device 150 is incident onto the light guide plate 153. The light guide plate 153 guides the light emitted from the light emitting device 150 to the whole area, so that the light serves as a surface light source. The reflective plate 151 reflects light leaking from the light guide plate 153. The optical sheet 155 diffuses and collects light from the light guide plate 153 to irradiate the light to the display panel 157.

The optical sheet 155 may comprise at least one of a diffusion sheet, horizontal and vertical prism sheets, and a brightness enhancement film. The diffusion sheet diffuses incident light, and the horizontal and vertical prism sheets condense light into a display region. The brightness enhancement film makes uniform brightness distribution.

The light emitting device 150, the reflective plate 151, the light guide plate 153, and the optical sheets 155 constitute a light unit.

The display panel 157 is a liquid crystal display (LCD) panel. The display panel 157 comprises first and second substrates, which face each other and comprise a transparent material, and a liquid crystal layer interposed between the first and second substrates. For example, the first substrate may be realized using a color filter array substrate, and the second substrate may be realized using a TFT array substrate. In contrast, the first substrate can be realized using a TFT array substrate and the second substrate can be realized using a color filter array substrate. The structure of the display panel 157 may be modified, and the embodiment is not limited thereto. A polarization plate may be attached to at least one surface of the display panel 157, and the embodiment is not limited to the attachment structure of the polarization plate.

As a modified example of FIG. 10, the light emitting device 150 may comprise at least three or four white light emitting devices which are aligned alternately or in a group unit while representing color tints of a complementary relation. Accordingly, white light can be realized by periodically arranging three or four white light emitting devices in a unit structure. In this case, the three white light emitting devices comprise a bluish white light emitting device, a yellowish white light emitting device, and a reddish white light emitting device. In addition, the four white light emitting devices comprise a bluish white light emitting device, a yellowish white light emitting device, a reddish white light emitting device, and a greenish white light emitting device. The grouped white light emitting devices may comprise white emitting device having different color tints, and the embodiment is not limited thereto.

Figure 11:
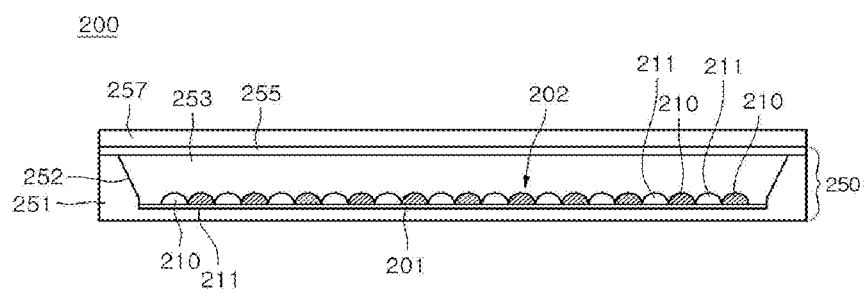
FIG. 11 is a side sectional view showing a display apparatus according to a fifth embodiment.
Figure 12:
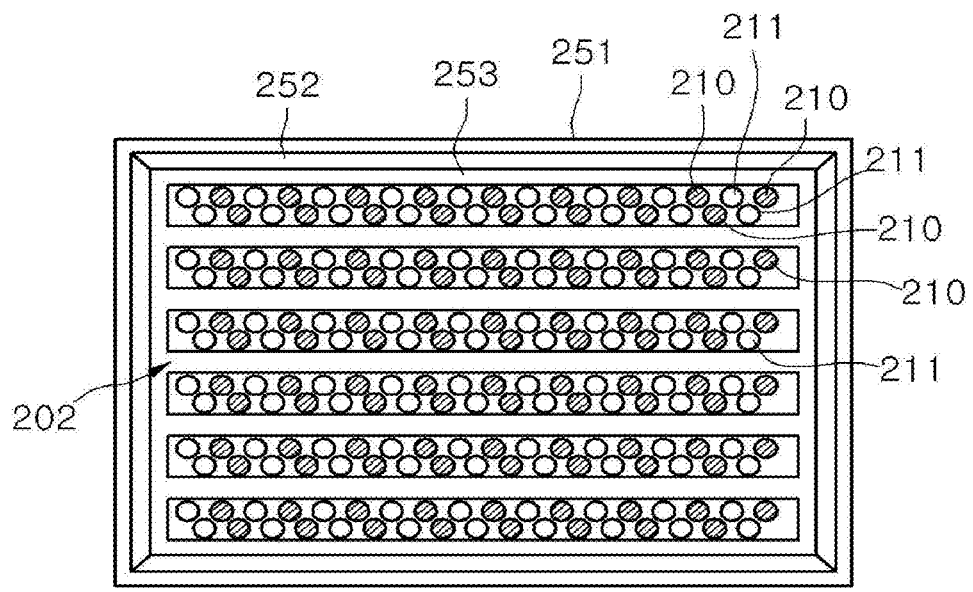
FIG. 12 is a plan view showing a light emitting apparatus of the display apparatus shown in FIG. 11.

FIG. 11 is a side sectional view showing a display apparatus 200 according to a fifth embodiment, and FIG. 12 is a plan view showing a light emitting device 202 of FIG. 11.

Referring to FIGS. 11 and 12, the display apparatus 200 comprises the light emitting device 202, a bottom cover 251, an optical sheet 255, and a display panel 257. The light emitting device 202, the bottom cover 251, and the optical sheet 255 constitute a light unit 250.

The bottom cover 251 comprises a cavity 253 having an opened upper portion. A side surface 252 of the cavity 253 may be inclined. The side surface 252 of the cavity 153 may be integrated with or separated from the bottom cover 251.

The light emitting device 202 is realized as a module. At least one light emitting device 202 may be arranged on a bottom surface of the cavity 253 of the bottom cover 251. The light emitting device 202 comprises first and second light emitting devices 210 and 211 alternately aligned with each other on a board 201 and having a complementary relation.

The first light emitting device 210 may emit bluish white light, and the second light emitting device 211 may emit yellowish white light. In other words, the first and second light emitting devices 210 and 211 have a complementary relation therebetween in a chromaticity area of white light.

The light emitting device 202 comprises at least three or four light emitting devices, which have a complementary relation in a target chromaticity area, and are alternately aligned one by one or in a group unit. Accordingly, white light can be realized by periodically aligning three or four white light emitting devices in a unit structure. In this case, the three white light emitting devices comprise a bluish white light emitting device, a yellowish white light emitting device, and a reddish white light emitting device. The four white light emitting devices comprise a bluish white light emitting device, a yellowish white light emitting device, a reddish white light emitting device, and a greenish white light emitting device. The grouped light emitting devices may comprise white light emitting devices having different color tints, and the embodiment is not limited thereto.

As shown in FIG. 12, a plurality of light emitting devices 202 are provided in the cavity 253 of the bottom cover 201. The light emitting devices 202 comprise the first and second light emitting devices 210 and 211 which have a complementary relation therebetween in a target chromaticity area and are alternately aligned with each other in two rows. In this case, the first and second light emitting devices 210 and 211 may be aligned in a zig-zag manner between adjacent rows.

The first and second light emitting devices 210 and 211 may be realized in the form of a chip on board (COB), in which a chip is mounted on the board 201, or a package on board (POB) in which a package is mounted on the board 201.

The optical sheet 255 may comprise at least one of a diffusion sheet, horizontal and vertical prism sheets, and a brightness enhancement film. The diffusion sheet diffuses incident light, and the horizontal and vertical prism sheets concentrate the incident light into a display area. The brightness enhancement film makes uniform brightness distribution.

The display panel 257 is an LCD panel. The display panel 257 comprises first and second substrates, which face each other and comprise a transparent material, and a liquid crystal layer interposed between the first and second substrates. For example, the first substrate may be realized using a color filter array substrate, and the second substrate may be realized using a TFT array substrate. In contrast, the first substrate may be realized using a TFT array substrate, and the second substrate may be realized using a color filter array substrate. The structure of the display panel 157 may be modified, and the embodiment is not limited thereto. A polarization plate may be attached to at least one surface of the display panel 257, and the embodiment is not limited to the attachment structure of the polarization plate.

According to the embodiment, the light emitting apparatus may be used as an illumination or a light source such as a front light unit and/or a backlight unit in an appliance such as a portable terminal, a portable computer, or broadcast equipment.

Any reference in this specification to "one embodiment," "an embodiment," "example embodiment," etc., means that a particular feature, structure, or characteristic described in connection with the embodiment is comprised in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

As described above, the embodiment provides a light emitting apparatus using a light emitting diode.

The embodiment provides a light unit equipped with a plurality of light emitting device.

The embodiment provides a display apparatus having the light unit.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A display apparatus comprising:
a light emitting apparatus which comprises a first light emitting device emitting a light of a target color tinged with a first color, and a second light emitting device emitting a light of the target color tinged with a second color complementary to the first color with respect to the target color;
a display panel which displays information by light irradiated from the light emitting apparatus; and
one of a first board, which comprises the first and second light emitting devices alternately aligned by at least one light emitting device, and a second board having at least one third light emitting device arrayed in a vicinity of the first light emitting device or the second light emitting device.

2. The display apparatus of claim 1, wherein the first light emitting device emits a bluish white light, the second light emitting device emits a yellowish white light, and at least one of the first and second light emitting devices has chromaticity distribution that is out of a target chromaticity area.

3. The display apparatus of claim 1, comprising at least one of a light guide plate, which irradiates light emitted from the light emitting apparatus to the display panel in a form of a surface light source, a reflective plate provided under the light guide plate, and an optical sheet provided on the light guide plate.

4. The display apparatus of claim 1, wherein the first and second light emitting devices comprise a package of an LED chip and a phosphor emitting light having a different wavelength by light emitted from the LED chip.

5. The display apparatus of claim 1, wherein the second light emitting device comprises at least one of a light emitting device emitting a yellowish white light, a light emitting device emitting a reddish white light, and a light emitting device emitting a greenish white light.

6. The display apparatus of claim 1, comprising at least one board alternately aligned the first and second emitting devices thereon, and an optical sheet provided on the board.

* * * * *